(12) United States Patent
Yang et al.

(10) Patent No.: US 6,660,581 B1
(45) Date of Patent: Dec. 9, 2003

(54) METHOD OF FORMING SINGLE BITLINE CONTACT USING LINE SHAPE MASKS FOR VERTICAL TRANSISTORS IN DRAM/E-DRAM DEVICES

(75) Inventors: Haining Yang, Wappingers Falls, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,034

(22) Filed: Mar. 11, 2003

(51) Int. Cl.$^7$ .......................................... H01L 21/8242
(52) U.S. Cl. ........................ 438/242; 438/243; 438/270
(58) Field of Search ................................ 438/238, 242, 438/243, 246, 259, 268, 270, 272

(56) References Cited

U.S. PATENT DOCUMENTS

| | | | |
|---|---|---|---|
| 6,368,912 B1 * | 4/2002 | Chang et al. ................. | 438/248 |
| 6,420,239 B2 * | 7/2002 | Weis .............................. | 438/386 |
| 2002/0090780 A1 * | 7/2002 | Divakaruni et al. ......... | 438/246 |
| 2002/0102778 A1 * | 8/2002 | Clevenger et al. .......... | 438/173 |
| 2003/0082876 A1 * | 5/2003 | Mandelman et al. ....... | 438/243 |

OTHER PUBLICATIONS

Radens et al., "An Orthogonal 6F$^2$ Trench–Sidewall Device Cell for 4Gb/16Gb Dram", IEDM, pp. 349–352, 2000.*

Radens et al., "A 0.135 βm 6F$^2$ Trench–sidewall Vertical Device Cell for 4Gb/16Gb Dram", Symposium on VLSI Technology Digest of Technical Papers, IEEE, pp. 80–81, 2000.*

* cited by examiner

Primary Examiner—Tuan H. Nguyen
(74) Attorney, Agent, or Firm—Graham S. Jones

(57) ABSTRACT

Form a bitline contact to deep trench gates separated from a substrate body by gate oxide with sources next to the gates near the top of the body and drains formed in the body of the substrate connected to a deep trench capacitor, with sidewall spacers between the gates and upper sidewalls of the deep trench. Form a patterning mask over the device exposing a portion of an upper surface of a gate electrode at the top surface of the substrate with a patterning mask patterned by a line shaping master mask. Etch a divot reaching down into the gate electrode alongside a deep trench sidewall spacer juxtaposed with a source. Fill the divot with a dielectric material. Form a wordline stack with a wordline and a silicon nitride cap in contact with the gate electrode. Form an etch resistant conformal liner and then form a planarized ILD layer and a glass layer covering the ILD layer. Form a bitline contact mask patterned by the line shaping master mask, with a bitline contact therethrough above the source region juxtaposed with the deep trench sidewall spacer. Etch a via hole down to the source region in the pattern of the bitline contact mask and form a bitline contact.

20 Claims, 14 Drawing Sheets

METHOD OF FORMING SINGLE BITLINE CONTACT USING LINE SHAPE MASKS FOR VERTICAL TRANSISTORS IN DRAM/E-DRAM DEVICES

BACKGROUND OF INVENTION

This invention relates to methods of manufacture of vertical transistors in DRAM and eDRAM devices and more particularly to methods for providing devices with reduced parasitic capacitance while employing an economical manufacturing process.

The vertical transistor DRAM/embedded DRAM allows us to use a line shaped mask to contact the bitline junction of the array as demonstrated by commonly assigned U.S. Pat. No. 6,245,651 of Divakaruni et al. for Method of Simultaneously Forming a Line Interconnect and a Borderless Contact to Diffusion. Lines are simpler to print and improve process yield. For DRAM with borderless contacts, the line contact mask increases the bitline capacitance and compromises performance. Hence, there is a need to make contacts only on one side of the wordlines (gate conductors).

Consequently, methods have been shown to allow one single borderless while still using a line shaped mask as shown by commonly assigned, copending U.S. patent application Ser. No. 10/026,119 filed on Dec. 21, 2001 of Divakaruni and Radens for DRAM Array Bit Contact with Relaxed Pitch Pattern. However, the variation of the gate conductor over the trench due to standard process variation is limited by the thickness of the spacer on the inside of the trench. This places a rather severe constraint on the overlay conditions for the printing of the wordline (gate conductor). The present invention provides a solution to this problem by using asymmetric spacers in the trench. By making the spacers asymmetric (or existing on only one side), the overlay constraints are greatly relaxed.

See U. Gruening, A Novel Trench DRAM Cell with a Vertical Access Transistor and Buried Strap (VERI BEST) for 4 Gb/ 16 Gb, IEDM Tech. Digest, pp. 2529 (1999).

Also see S. Wuensche, A 110 nm 512 Mb DDR DRAM with Vertical Transistor Trench Cell. 2002 Symposium on Circuits Digest of Technical Papers, IEEE, pages 114–115 (2002).

In the current state of the art, 110 nm generation vertical transistor DRAM devices require one bitline contact per cell to reduce bitline parasitic capacitance to meet high speed specifications, such as a Double Data Rate II (DDR—II) DRAM type of device.

The state of the art has been to employ a 193 nm single contact mask to form the bitline contact. However, the cost of the 193 nm mask and the required equipment to perform the required photolithography is very high. Moreover, for that purpose the Deep Trench (DT) has to be shifted to one side to prevent a short circuits between the DT polysilicon (Deep Trench polysilicon) and the bitline contact which is a problem because it complicates the integration process and has an adverse impact on product yield because of excessive short circuits.

SUMMARY OF INVENTION

In accordance with this invention a one-side spacer is provided to prevent short circuits between the bitline contact and vertical gate polysilicon. The advantage of the provision of the one-side spacer improves photomask misalignment tolerance for higher product yields.

Another advantage of the present invention is that a 248 nm mask is used which is much more economical than the 193 nm photomask employed in the industry currently as the state of the art practice.

The method of this invention makes it possible to form a single Bitline Contact (BC) using more mature 248 nm masks to reduce cost and to improve photomask misalignment tolerance.

The method of this invention makes it possible to form a unique pattern for a bitline contact VIA in DRAM/e-DRAM devices using a mature generation of photolithography technology to reduce cost and improve yield.

A unique pattern of inside spacers (using older generation lithography technology) are formed in the deep trench of the vertical gate transistor DRAM/e-DRAM array to prevent shorts between the wordlines and the bitlines.

A dual damascene process is used to form the bitline contact via and to form bitlines.

In accordance with this invention, a method is provided form forming a bitline contact in an integrated circuit structure, including a substrate with a top surface and a body, a plurality of deep trenches formed in the body with upper and lower sidewalls, with a deep trench capacitor and a gate electrode formed in the deep trenches, the gate electrodes being separated from the body by gate oxide and the deep trench capacitors being separated from the body by capacitor dielectric layers; a doped source region juxtaposed with the gate electrodes near the top surface aside from the gate oxide; and drain regions formed in the body of the substrate connected to the capacitor, with sidewall spacers between the gate electrodes and the upper sidewalls of the deep trench. The method comprises te following steps. Form a patterning mask over the device exposing a portion of an upper surface of a gate electrode at the top surface of the substrate, the patterning mask being patterned by the line shaping master mask. Etch a divot reaching down into the gate electrode alongside a deep trench sidewall spacer juxtaposed with a source region. Fill the divot with a dielectric material. Form a wordline stack with a wordline and a silicon nitride cap in contact with the gate electrode. Form a conformal liner which is etch resistant covering the structure. Form a planarized ILD layer covering the conformal liner. Form a glass layer covering the planarized glass layer. Form a bitline contact mask patterned by the line shaping master mask, with a bitline contact therethrough above the source region juxtaposed with the deep trench sidewall spacer. Etch a via hole down to the source region in the pattern of the bitline contact mask and form a bitline contact in the via hole.

Preferably, the divot is filled with silicon nitride by depositing a thick layer thereof followed by planarization, and the etch resistant liner comprises a conformal layer of silicon nitride.

Preferably, the bitline contact mask has been formed over an M0 wiring line hard mask and the bitline contact mask is employed to etch an opening through a line in an M0 hard mask through the dielectric layer therebelow including a portion of the liner covering the wordline with an etchant selective to the hard mask and then remove the bitline contact mask and etching selective to the etch resistant liner.

Preferably, the bitline contact mask has an opening projecting at right angles in the horizontal plane relative to the opening in the M0 hard mask. Preferably, the ILD layer is a BSPG layer which is next planarized by CMP and then covered in turn by a TEOS glass layer.

BRIEF DESCRIPTION OF DRAWINGS

The foregoing and other aspects and advantages of this invention are explained and described below with reference to the accompanying drawings, in which.

DETAILED DESCRIPTION

Figure 1A:
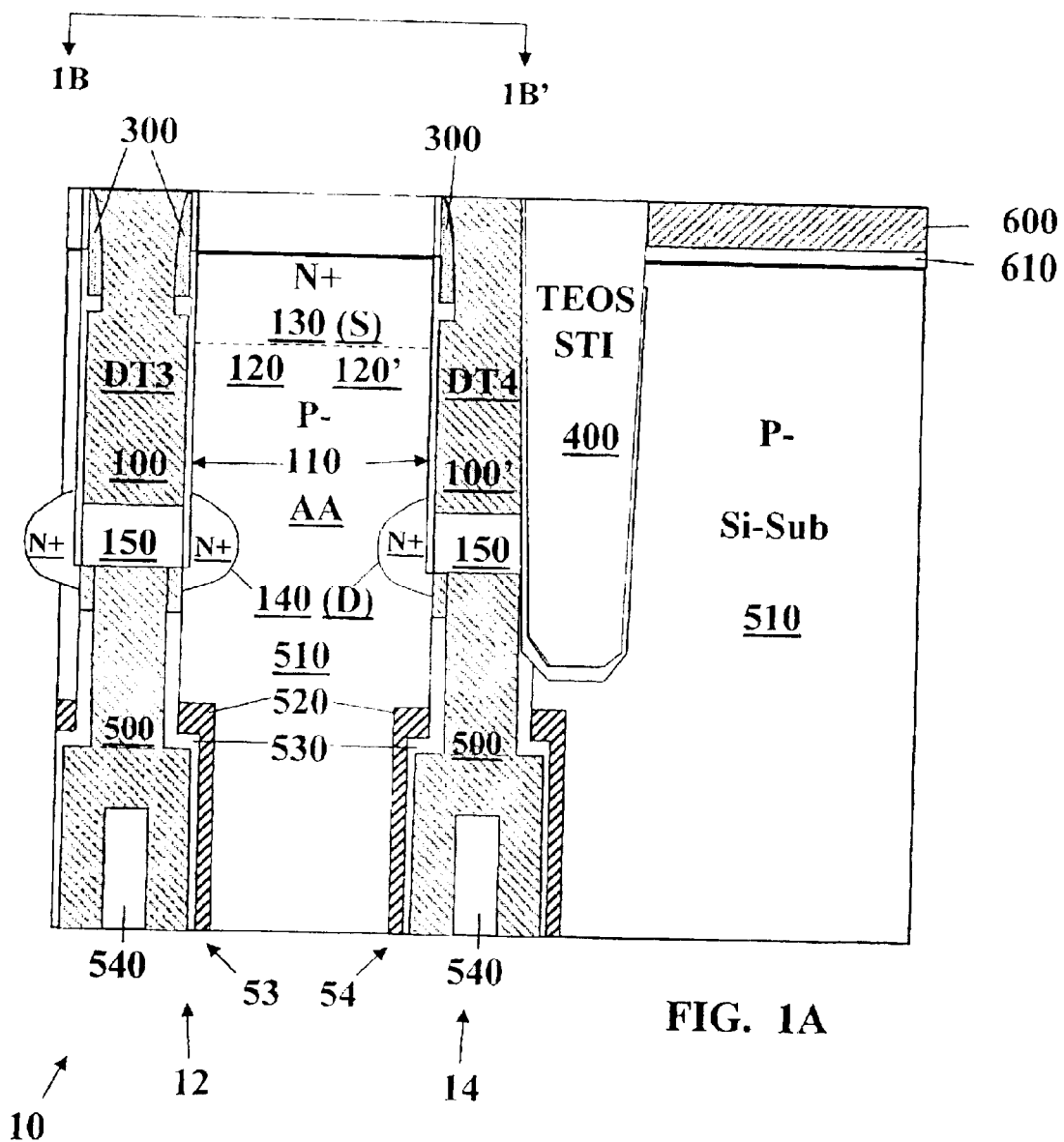
FIG. 1A is a cross-sectional view of a vertical MOSFET structure showing one vertical cell DRAM device in an array of DRAM or e-DRAM devices after ATO (Array Top Oxide) planarization taken along line 1A–1A' in FIG. 1B.
Figure 1B:
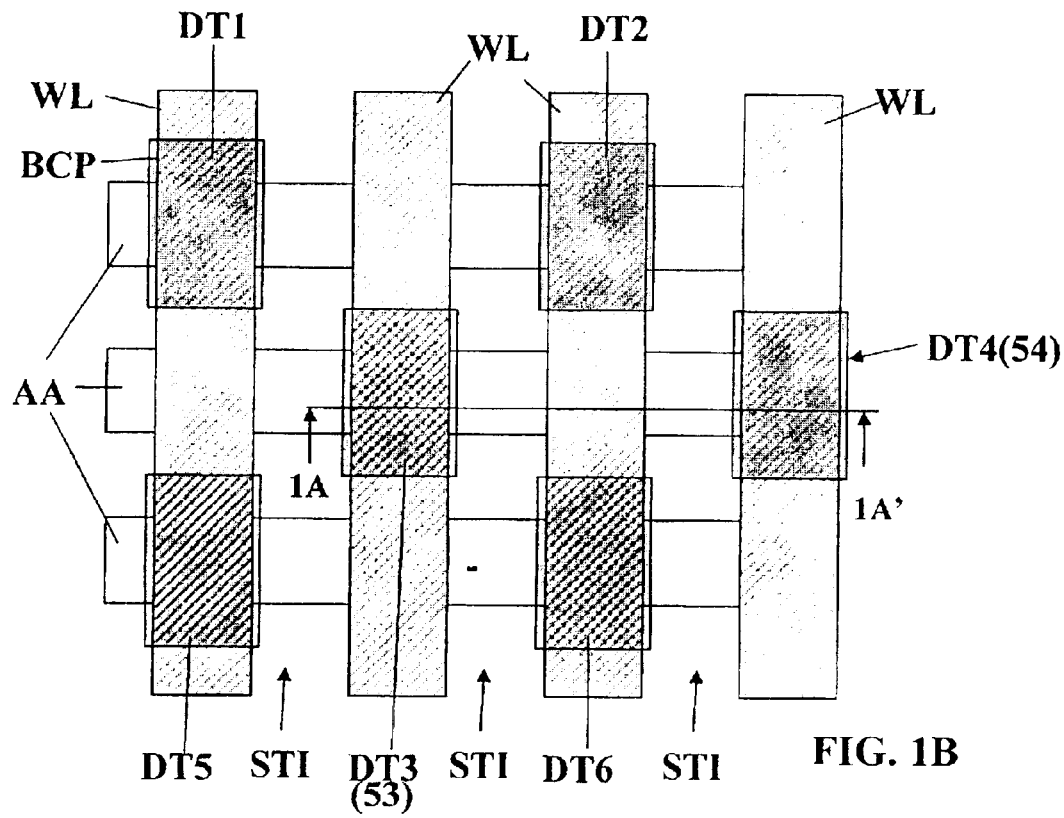

FIG. 1A is a cross-sectional view of a one vertical cell DRAM device in an array of DRAM or e-DRAM devices in a vertical MOSFET vertical MOSFET structure 10 after ATO (Array Top Oxide) planarization taken along line 1A–1A' in FIG. 1B which is a plan view of a larger portion of a structure including the devices shown in FIG. 1A. Shallow Trench Isolation (STI) regions are shown between the word lines WL.

FIG. 1B shows a plan view of the layout of an array of vertical cells in a DRAM or EDRAM microchip, where deep trench (DT) capacitors and vertical transistors are formed using standard process methods after an ATO silicon oxide process. Up to this point the process employed is standard but the structure will be described in some detail to clarify the problem that exists.

DRAM/e-DRAM Device Array

In FIG. 1B an array of horizontal active areas AA are shown. The active areas AA are formed in a silicon substrate 510 shown in FIG. 1A. An array of vertical word lines is formed crossing over the active areas AA. Six deep trenches DT1–DT6 are shown formed at the intersections of the wordlines WL with the active areas AA.

Array Vertical Transistors

Figure 11B:
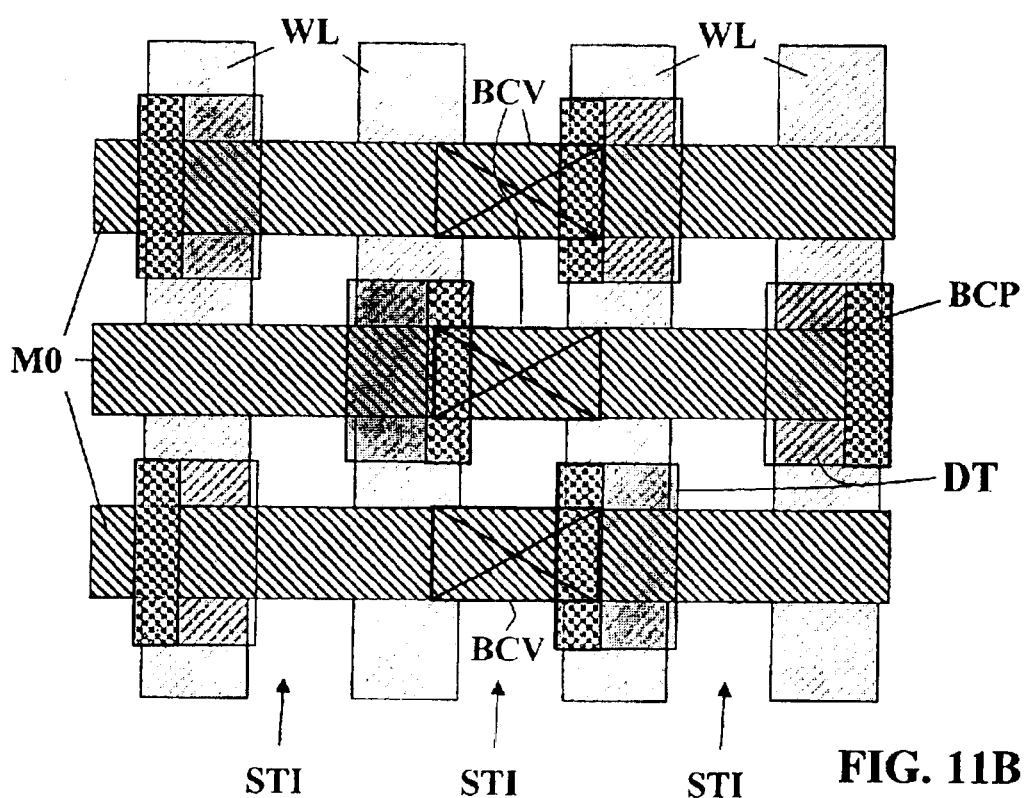
FIGS. 11A and 11B show the structure of FIG. 10 after a hard mask has been removed.
Figure 11A:
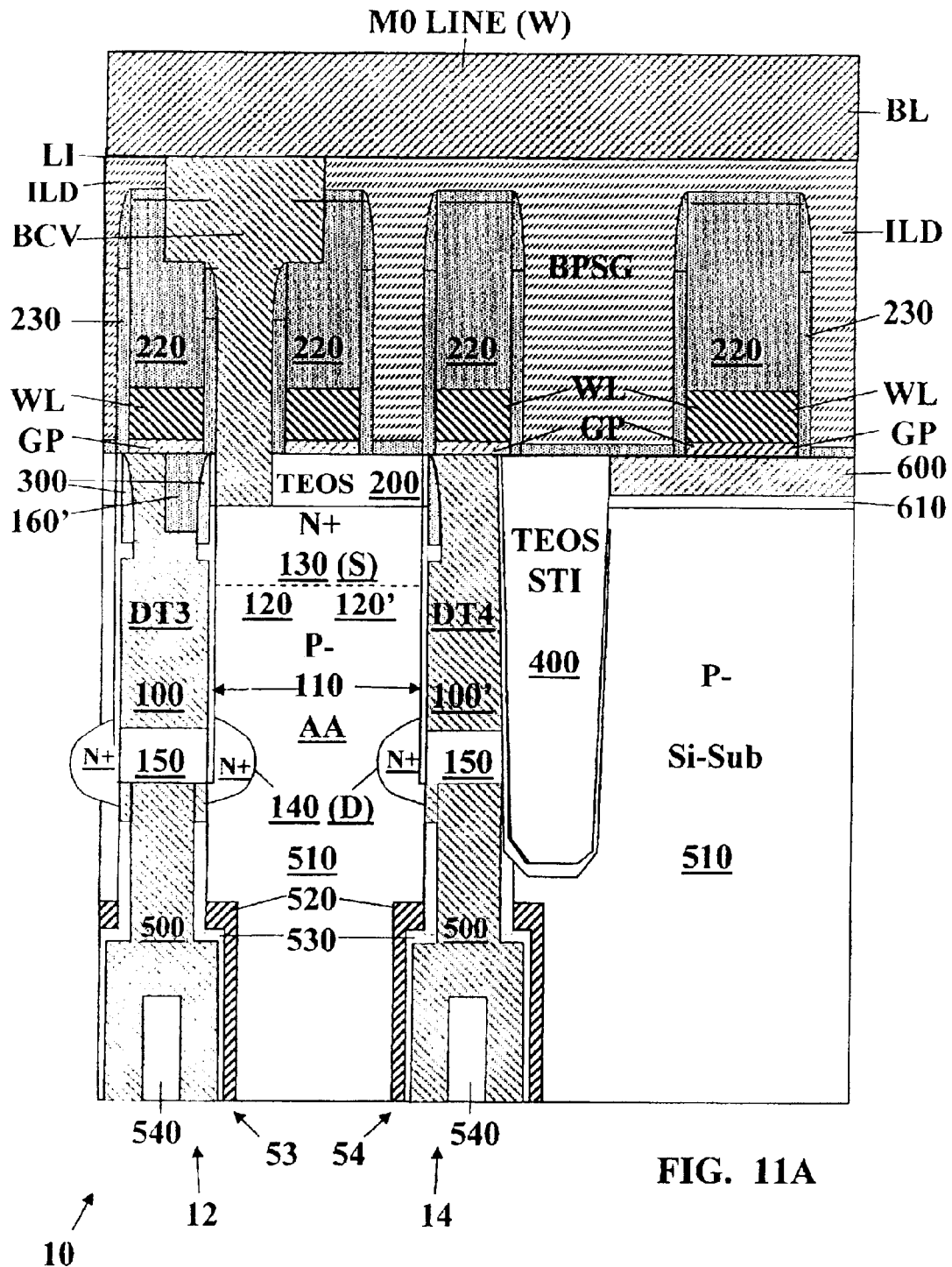

Referring to FIG. 1A, sectional elevation views of two vertical transistor MOSFET devices 12 and 14 are shown formed in a P-doped region of silicon substrate 510. The devices 12/14 include respective deep trenches DT3/DT4 which are shown reaching down into substrate 510 from the top surface thereof. The upper portions of the trenches DT3 and DT4 are lined with a gate oxide layer 110 (dielectric) and are filled, at the top, with trenches DT3/DT4 including vertical gate electrodes 100/100' (polysilicon) that serve as the vertical gate electrodes of FETs. Aside from each of the vertical gate electrodes 100, on the opposite side of the gate oxide layer 110 of the trenches DT3/DT4 is a transistor channel 120/120'. At the top of the space between the deep trenches DT3/DT4 is a common N+ doped source region 130 adapted for connecting with the common bit line via BCV as seen in FIG. 11A. Along side the bottom of each of the vertical gate electrodes 100/100' is an N+ doped drain region 140 electrically connected to a capacitor electrode 500 of the respective capacitor 53/54. The corresponding source regions 130 and the drain regions 140 of the two vertical transistor MOSFET devices 12 and 14 are separated from the vertical gate electrodes by the gate oxide layers 110 in accordance with the usual design of MOSFET devices.

Deep Trench Capacitor

A set of deep trench capacitors 53/54 are formed deep inside the respective deep trenches DT3/DT4. Below gate polysilicon 100 is Trench Top Oxide (TTO) insulation layer 150. The deep trenches DT3/DT4 are lined with capacitor dielectric layer 530 below the TTO layer 150. The capacitor dielectric layer 530 insulates the gate polysilicon 100 from the inner capacitor electrode 500 (doped polysilicon), which includes a void 540 on the bottom that was formed during the polysilicon fill process that formed the capacitor electrode 500. On the outside of the capacitor dielectric layer 530 is doped silicon 520 which forms the outer electrode of the trench capacitors 53/54. The doped silicon 520 was formed by doping the silicon in the sidewalls of capacitor portion of the deep trenches DT3/DT4 before the capacitor dielectric layers 530 were formed, as will be well understood by those skilled in the art. The top of the capacitor electrode 500 is connected to the N+ doped drain region 140 of the respective one of the FETs 12/14 associated with the deep trench DT3, DT4, etc.

Array Structure

An array top oxide layer 200 composed of TEOS glass is formed above the common source region 130. It is necessary to electrically separate the vertical gate electrodes 100/100' in deep trenches DT3/DT4 from the source region 130 and the bit line to be formed thereabove (see bitline connection via BCV in FIG. 11A) which will be connected thereto through the array top oxide layer 200. Accordingly, a set of inside spacers 300 is formed in the upper neck of the deep trenches DT3/DT4 where the connections are to be made from the vertical gate electrodes 100/100' to the word lines to be formed thereabove (See wordlines WL in FIG. 5).

On the periphery of the array of deep trench vertical transistors 12/14, shown juxtaposed with the right side of the deep trench DT4 is a conventional STI (Shallow Trench Isolation) trench 400 that has been formed filled with TEOS silicon oxide. The STI trench 400, which reaches down into the silicon substrate 510, is shown next to deep trench DT4 for purpose of illustration. On the surface of the P-doped silicon substrate 510 on the opposite side of an STI trench 400 is a peripheral transistor gate oxide layer 610 covered by a layer of doped polysilicon 600.

A potential electrical problem exists when an electrical connection is made from a wordline WL through a gate polysilicon contact layer GP to the top surface of the vertical gate electrode 100 and the top surface of source region 130 is connected to a bit line contact via BCV as shown in FIG. 11A. As the distance between the sidewalls of a deep trench DT3/DT43 is scaled to smaller and smaller dimensions, the wordline WL has an increasing influence on the potential in the silicon in the body of the source region 130 of the vertical MOSFET. This increases the likelihood of conduction between vertical gate electrode 100 and bitline contact via BCV (FIG. 11A).

Forming Silicon Nitride Spacer Using 248 nm Mask

Figure 2B:
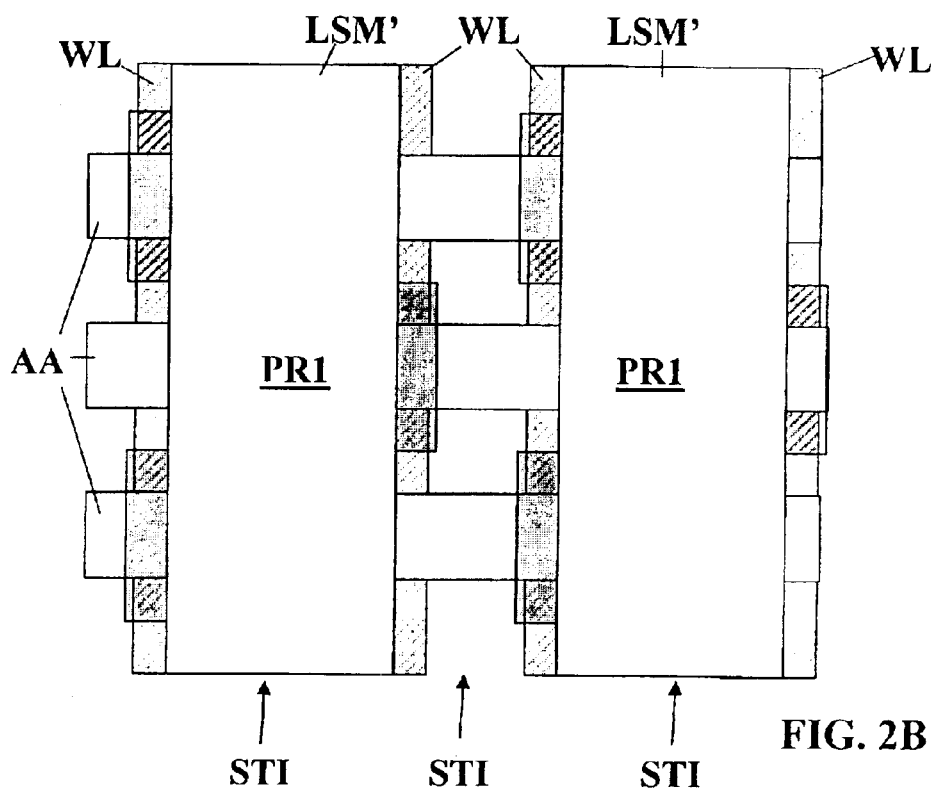
FIGS. 2A and 2B show the vertical MOSFET structure of FIGS. 1A and 1B after a 248 Nm Line Shape Mask (LSM) (which is a photolithographic exposure mask of the kind employed in photolithographic steppers ) has been used to expose a first photoresist mask, following which an opening through the first photoresist mask has been employed to etch a divot in the top of the polysilicon of the vertical gate electrode in the left hand deep trench between a spacer at the periphery of the vertical gate electrode and the sidewall of the mask.
Figure 2A:
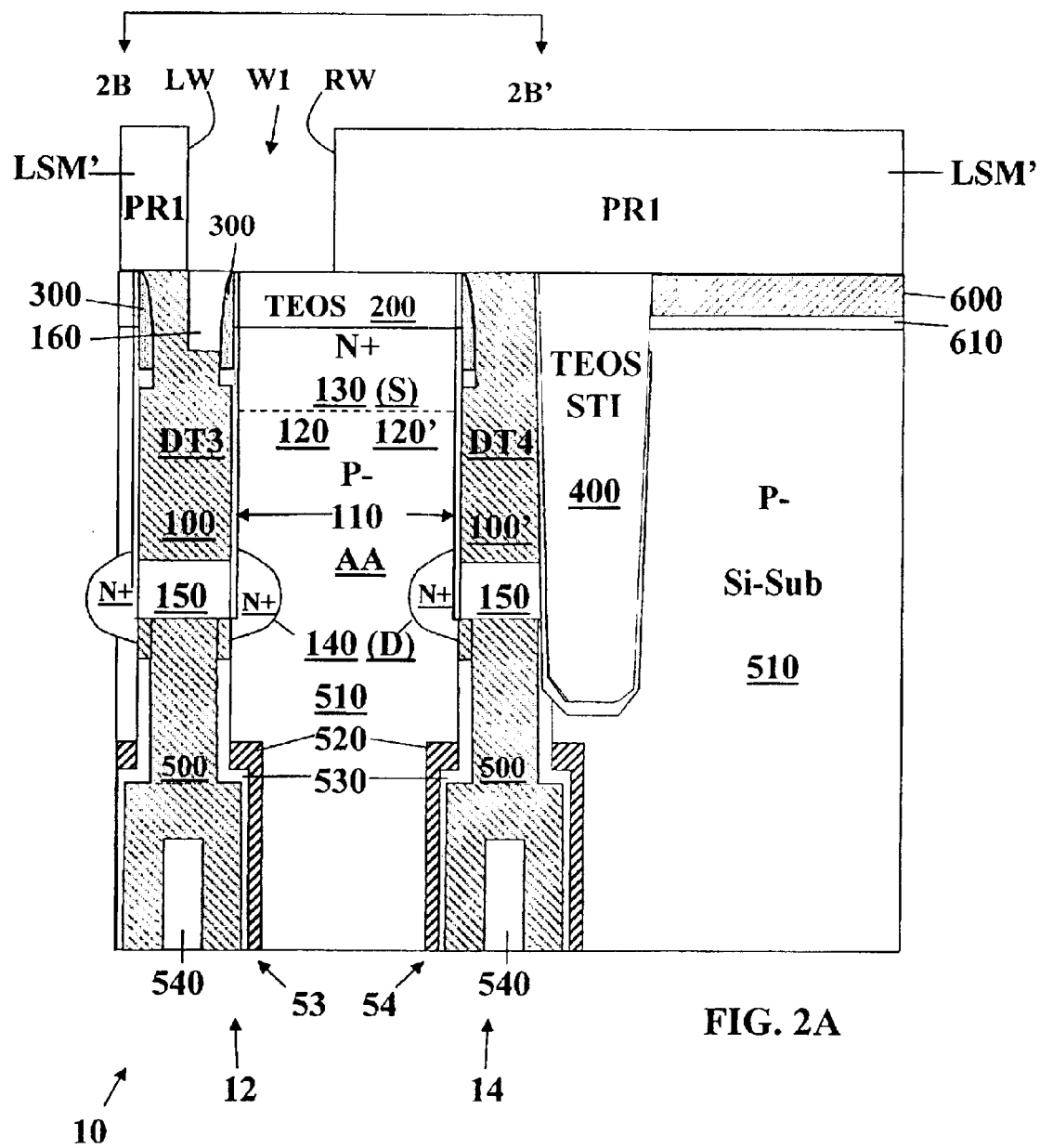

FIGS. 2A and 2B are sectional and plan views respectively which show the vertical MOSFET structure 10 of FIGS. 1A and 1B after a 248 nm line shape photo-resist PR1 mask LSM' (has been applied to etch a divot 160 in the top of the poly-silicon of the vertical gate electrode 100 of transistor 12 in the left hand deep trench DT3. FIG. 2A is a cross-sectional view of the vertical MOSFET structure 10, cover-ed with a patterned first photoresist (PRI) line shape mask LSM' with a window W1 therethrough. The PR1 line shape mask LSM' was patterned by a master 248 nm Line Shape Mask (LSM) that is a conventional master mask (not shown) of the kind employed in conventional photolithographic steppers which was used for photolithographic exposure of the PR1 photoresist film. The resulting PR1 photo-resist mask LSM' was then used to expose a portion of the surface of the vertical gate electrode 100 which reaches down from the top of the deep trench DT3 to a depth well below the top surface of vertical gate electrode 100 in deep trench DT3.

The divot 160, which has been formed in the upper surface of the polysilicon vertical gate electrode 100 in a self-aligned etching step, is located in the surface of the vertical gate electrode 100 between the left wall LW of the window WI and the spacer 300. During the etching step, the etchant forming the divot 160, removed a portion of the top surface of the polysilicon 100, so that divot 160 is juxtaposed with the inside spacer 300 at the upper neck of the polysilicon of the vertical gate electrode 100 in deep trench DT3.

Figure 5:
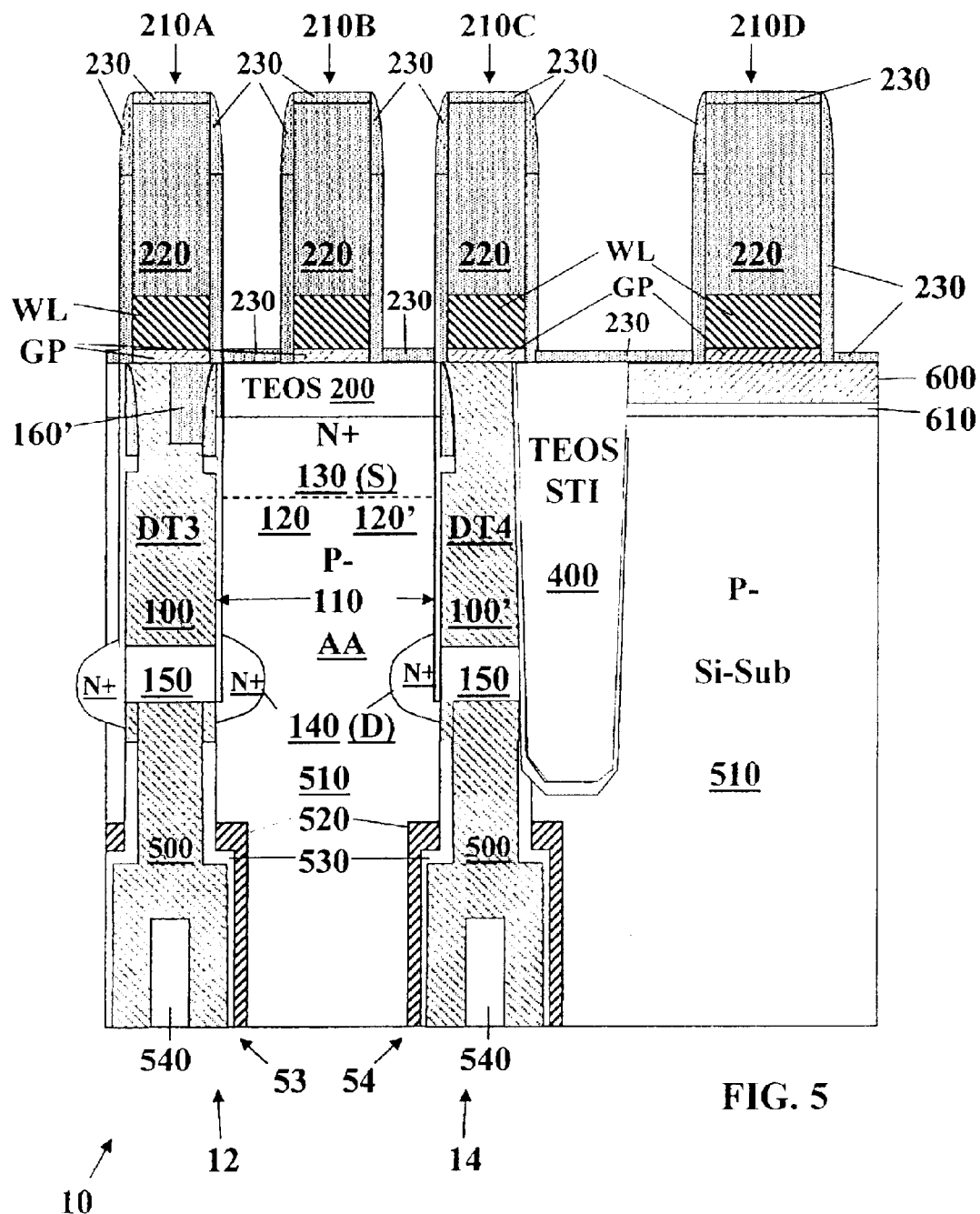
FIG. 5 shows the structure of FIG. 4A after stacks of gate polysilicon, wordlines and silicon nitride caps have been formed above the deep trenches, therebetween and aside therefrom using standard processing methods.

To define the correct location of the divot 160, the PR1 mask LSM' with its window W1 has been aligned so that the left wall LW of the window W1 is aligned above the middle of the top surface of the vertical gate electrode 100. The right wall RW of window W1 is aligned over the middle of the TEOS top oxide 200 above the common source region 130 with a wide latitude of positions of window W1 being permissible with the limitation that the left wall LW can not expose all of the upper surface of the vertical gate electrode 100 in the deep trench DT3, since it is necessary to leave a sufficient amount of the top surface of the vertical gate electrode 100 in place for connection of the vertical gate electrode to external contacts GP and wordline WL as shown in FIG. 5 and subsequent sectional views of the vertical MOSFET structure 10.

FIG. 2B shows a plan view of the vertical MOSFET structure 10 with the PR1 mask LS' overlying the surface thereof. The PR1 mask LSM' is used to print line patterns in the memory array as shown in FIG. 2A, where part of the left hand deep trench DT3 of transistor 53 is exposed so that some of the vertical gate electrode 100 of doped polysilicon can be etched using a Reactive Ion Etching (RIE) process. The etch is selective to polysilicon so silicon oxide, e.g. array top oxide 200, is not removed. Thus the divot 160 is formed in the top portion of the left hand deep trench DT3.

Figure 3:
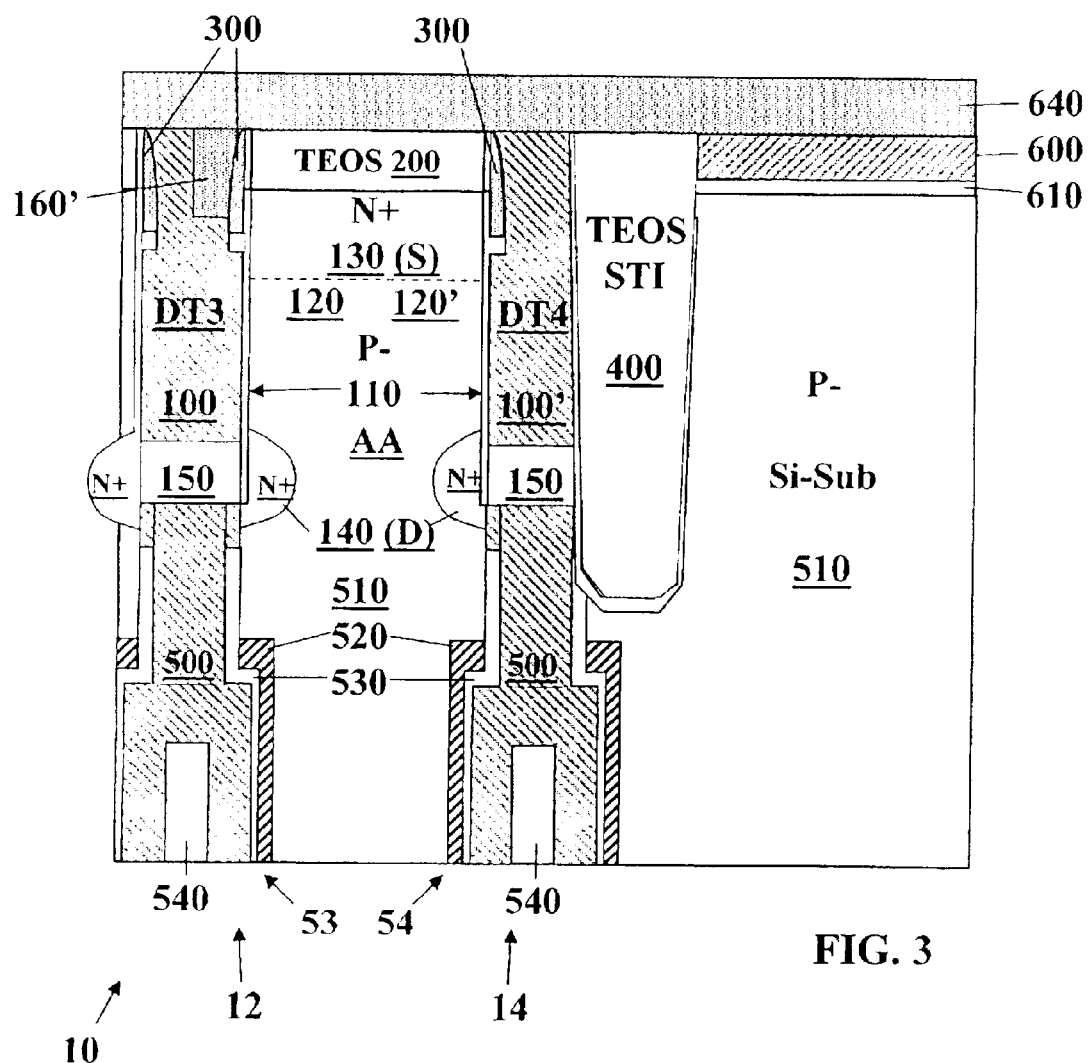
FIG. 3 is a sectional view of the structure of FIGS. 2A shown after the 248 nm mask has been stripped from the surface of device.

FIG. 3, a sectional view of the device of FIG. 2A is shown after the 248 nm PR1 photoresist mask LSM" has been stripped from the surface of vertical MOSFET structure 10. Then the divot 160 has been filled by deposition of a planar, blanket silicon nitride layer 640 which covers the top surface of the vertical MOSFET structure 10. By filling the divot 160 with silicon nitride layer 640, a one-sided spacer 160' which fills the divot is an integral part of silicon nitride layer 640.

Figure 4A:
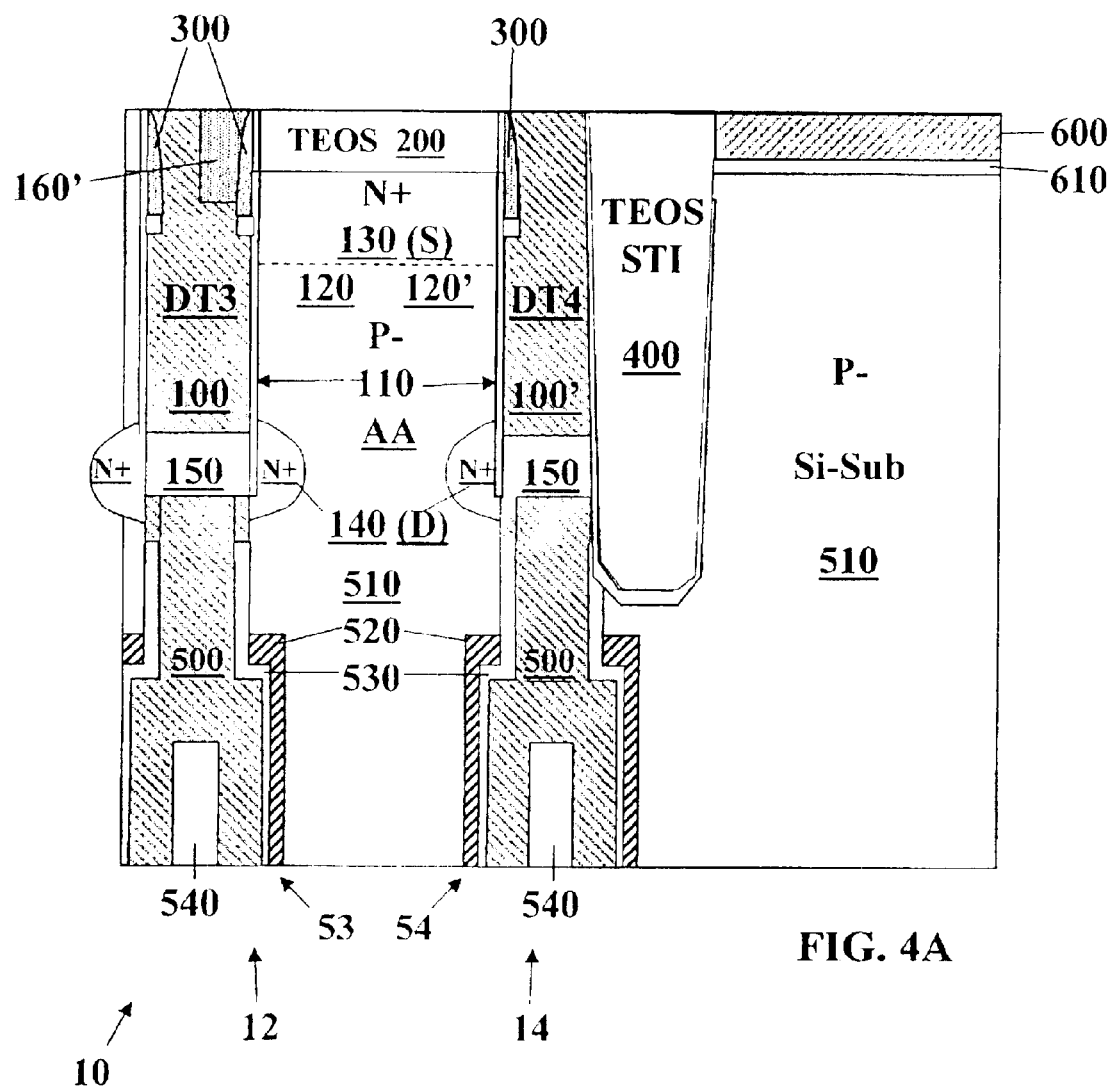
FIG. 4A shows a sectional view of the structure of FIG. 5 after a processing step of CMP or RIE has been used to remove the surplus silicon nitride layer from the wafer surface, leaving the one-side spacer filling the divot.

FIG. 4A shows a sectional view of the vertical MOSFET structure 10 of FIG. 3 after a processing step of Chemical Mechanical Polishing (CMP) or Reactive Ion Etching (RIE) has been used to remove the surplus silicon nitride layer 640 from the wafer surface, leaving the one-side spacer 160' filling the divot 160. The one-side spacer 160' is provided to prevent short circuits (shorts) between the polysilicon vertical gate electrode 100 and the bitline contact BCV (that connects to source regions 130 in FIG. 11A). In other words, the silicon nitride one-side spacer 160' which fills the divot 160 can prevent electrical short circuits between the gate polysilicon 100 and Bitline Contact Vias (BCV), one of which is shown in FIG. 11A, which will be formed above the TEOS top oxide 200 in subsequent steps of the process of this invention. It improves photomask misalignment tolerance among wordline WL/gate conductor (GC)-to-DT, bitline contact (BC)-to-DT, or BC-to-GC.

Figure 4B:
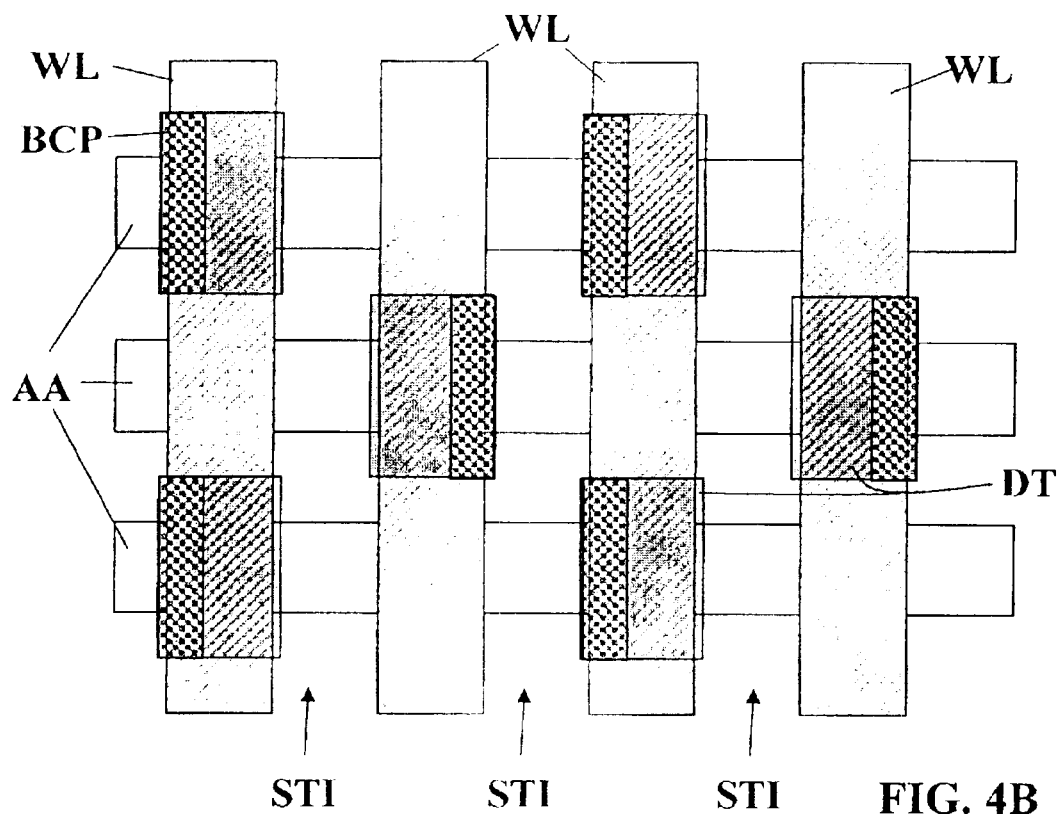
FIG. 4B shows the plan view of the structure of FIG. 4A.

FIG. 4B which is a plan view of FIG. 4A shows the plan view of the structure 10 of FIG. 4A with the addition, for convenience of illustration, of bit contacts BCP and wordlines WL shown formed over the structure 10 of FIG. 4A.

FIG. 5 shows the structure 10 of FIG. 4A after stacks 210 of the gate polysilicon GP (over the gate electrodes 100/100'), wordlines WL and silicon nitride caps 220 have been formed above the deep trenches DT3/DT4, above TEOS 200 and above layer 600, using standard processing methods. Silicon nitride caps 220 are formed above the wordlines WL. Then a conformal silicon nitride liner 230 is formed on the structure covering the surfaces of TEOS 200, the STI 400, caps 200, and the doped polysilicon 600 of the peripheral structure. The liner layer 230 also covers the sidewalls of the caps 220 and the wordlines WL and the edges of the gate polysilicon GP. Thus silicon nitride liner 230 is formed using standard processes.

Figure 6:
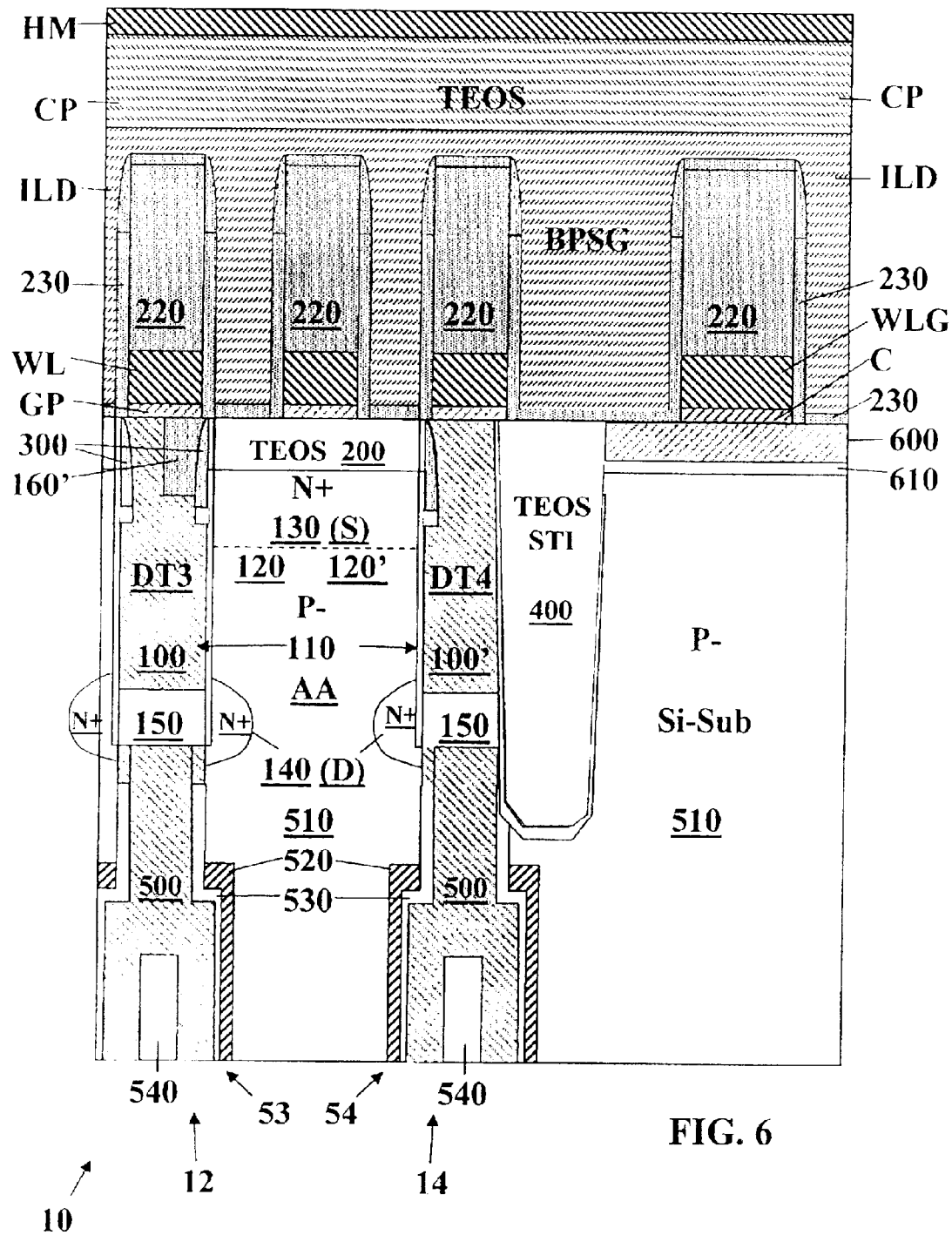
FIG. 6 shows the structure of FIG. 5 after a thick, blanket layer of Inter-Layer Dielectric layer has been deposited, annealed, and planarized by CMP and planarized followed by deposition of a planar oxide cap layer.

FIG. 6 shows the structure 10 of FIG. 5 after a thick, blanket layer of Inter-Layer Dielectric layer ILD preferably composed of BPSG has been deposited, annealed, and planarized by CMP and planarized leaving the dielectric ILD layer filling the space between the caps 220 and covering the caps 220. The formation of the dielectric layer ILD is followed by deposition of a planar M0 silicon oxide (TEOS) cap layer CP. Above the TEOS cap layer CP a blanket polysilicon layer HM which is to be transformed into a hard mask HM has been deposited on the planarized surface of the TEOS cap layer CP. As stated above, the hard mask layer HM is to be patterned subsequently into a hard mask for the purpose of forming a patterning mold for the local wiring metal line (M0). All of the steps in connection with FIG. 6 are standard processing steps for DRAM devices.

Formation of M0 Transverse Line Pattern in Hard Mask

Figure 7:
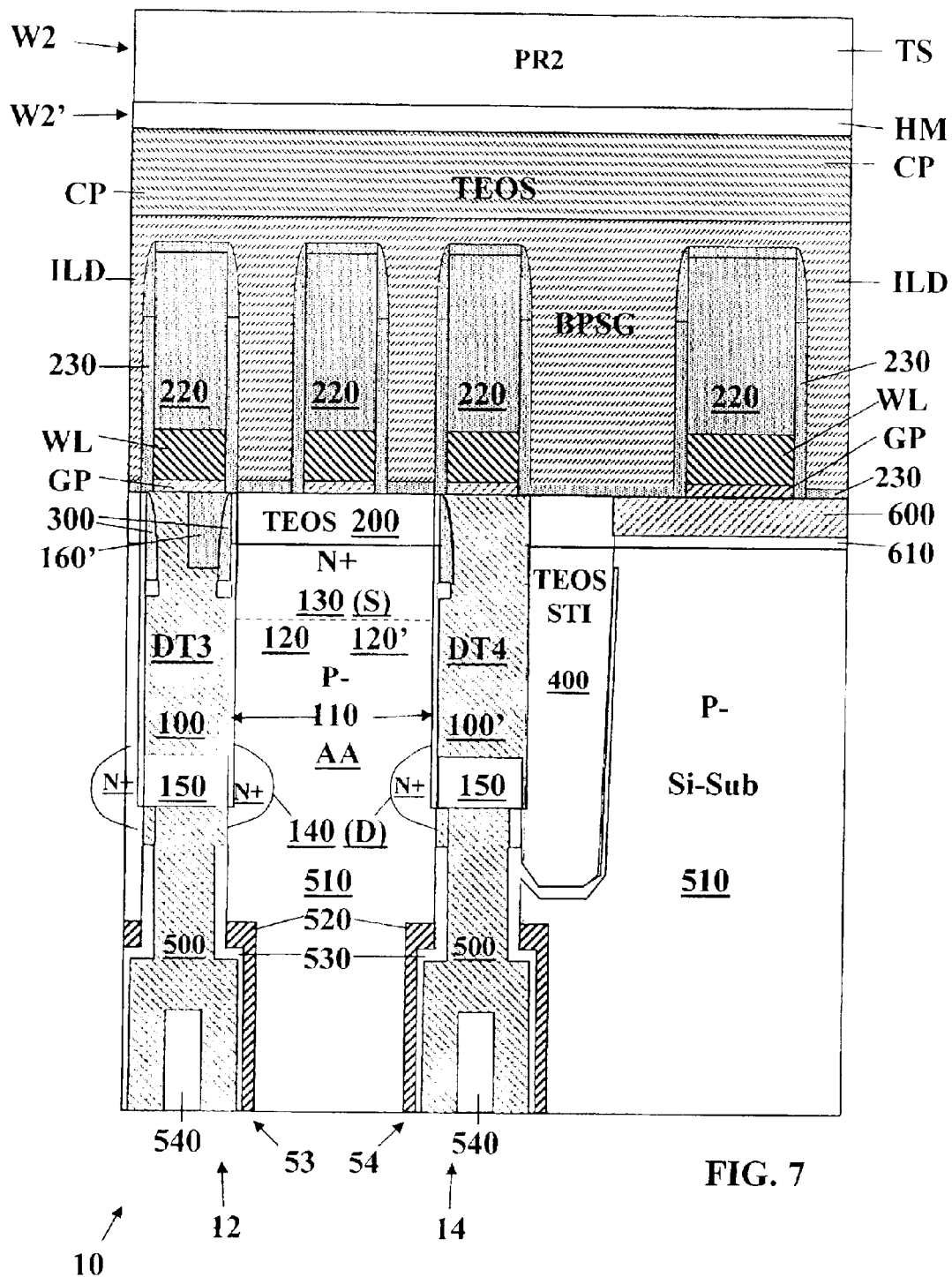
In FIG. 7, a 193 nm photomask (not shown) comprising the line shaping mask was applied for MO line patterning to the structure of FIG. 6.

In FIG. 7, the structure 10 of FIG. 6 was covered with a PR2 photoresist layer which was exposed with a 193 nm photomask to form a photoresist mask TS with a transverse window W2 therethrough. The window, which extends from left to right, transversely across the page, was applied for producing an M0 local wiring line pattern in the polysilicon hard mask HM by etching a transverse line extending from left to right, providing a sidewall parallel to the page aligned as shown in FIG. 8B and FIG. 11B. The steps are all in accordance with the standard process flow. The M0 local wiring line is oriented in the direction perpendicular (from left to right across the page) with respect to the wordlines WL, which extend back into the page in FIG. 7 and other sectional views thereof. Using an RIE etching process, the polysilicon hard mask HM is etched and a portion of the TEOS silicon oxide layer CP underneath is exposed, i.e. layer CP is partially exposed below the window W2, but is otherwise covered by the mask TS. The purpose of the etch is to transfer the line pattern defined by the window W2 into a matching transverse window W2' down through the polysilicon hard mask. Then the M0 PR2 photoresist layer TS is stripped from the vertical MOSFET structure 10 as seen in FIG. 8A, where it has been replaced by PR3 line shape mask LSM which has the same pattern as the PR1 line shape mask LSM' in FIG. 2A.

Bitline Contact Patterning

Figure 8A:
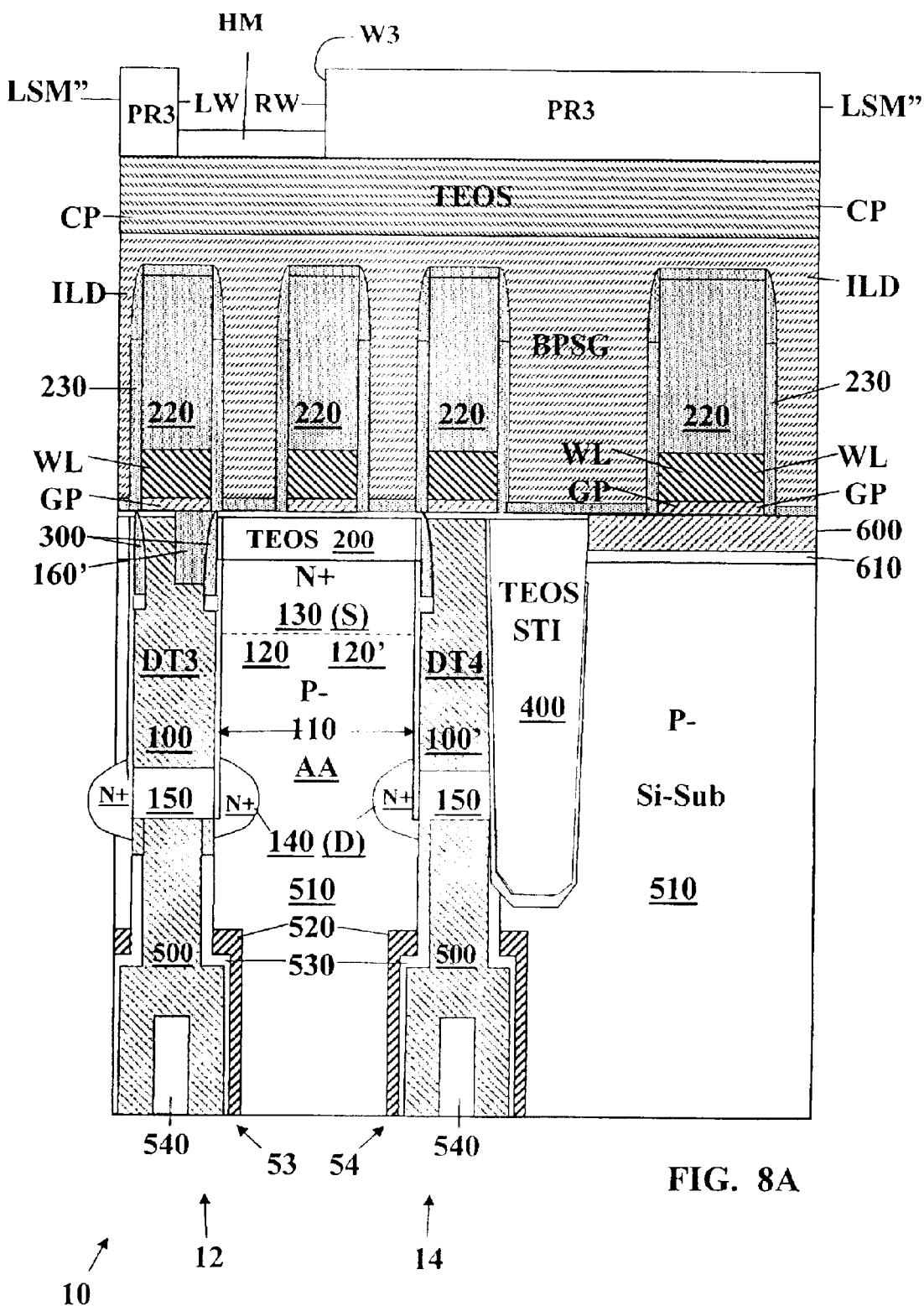
FIGS. 8A and 8B show the structure of FIG. 7 after the same 248 Nm Line Shape Mask (LSM) used in FIGS. 1A and 1B has been used to pattern an M0 line photoresist mask, after which the M0 line pattern is printed and etched using the RIE process.
Figure 8B:
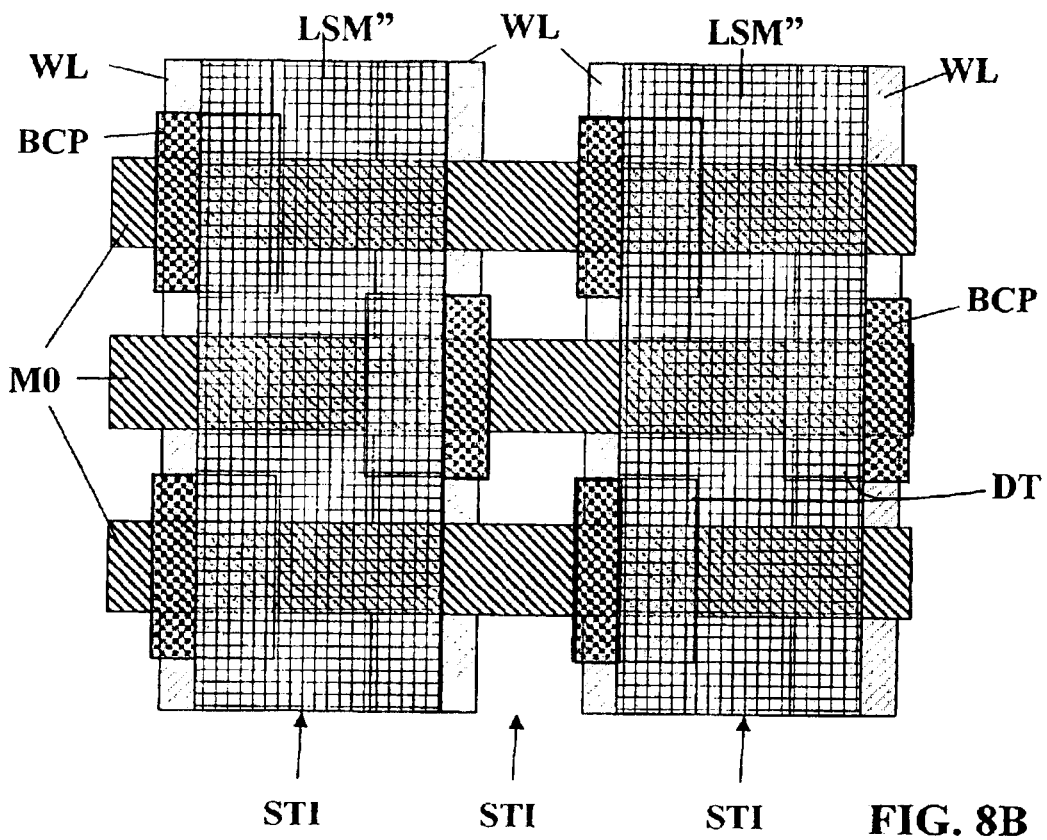
Figure 9:
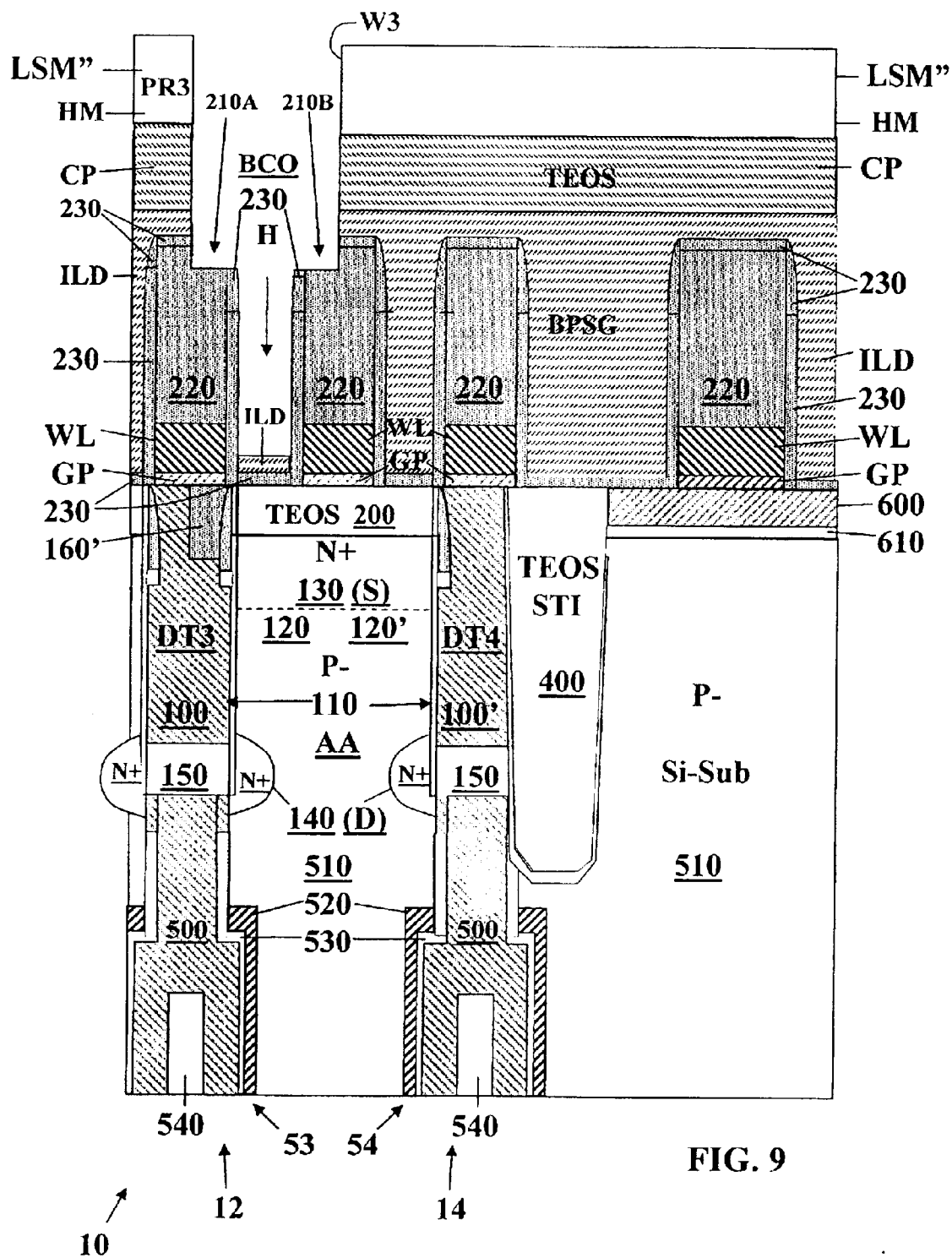
FIG. 9 is a cross-sectional view of the structure of FIG. 8 that shows the result of etching structure through a window through the 248 nm line-shaping mask to partially form a bitline contact opening BCO for a via.

FIGS. 8A and 8B show the device of FIG. 7 after the 248 nm master mask or Line Shape Mask (LSM) used in FIGS. 1A and 1B has been used to pattern the photoresist PR3 mask LSM. To produce the results seen in FIGS. 8A and 8B the same master mask, the 248 nm LSM (the same master mask which was previously used to pattern the first PR1 mask LSM' with the window W1 in FIGS. 2A and 2B) was used to pattern the PR3 photoresist layer that was deposited covering the top surface of the vertical MOSFET structure 10 including newly M0 line patterned hard mask HM with the window W2' therethrough. Thus the PS3 photoresist layer is patterned and developed to form a PR3 photoresist mask LSM with a window W3 therethrough extending back into the page centered over the space between the leftmost two wordlines WL exposing a portion of the hard mask HM therebelow and the window W2', just above where the bitline contact is to be formed. The photoresist PR3 mask LSM is now ready to be used for array bitline patterning of the vertical MOSFET structure 10 by etching a Bitline Contact Opening BCO as shown in FIG. 9. FIG. 8B shows the layout of the photoresist mask LSM that has been exposed with the 248 nm master Line Shape Mask (LSM) which has been applied in this case to prepare for array bitline contact patterning.

FIG. 9 is a cross-sectional view of the structure 10 of FIG. 8 that shows the result of etching structure 10 through the window W3 through the 248 nm PR3 line-shaping mask LSM to partially form a bitline contact opening BCO for a via bitline contact opening BCO has been formed by using the opening W3 to etch down through the hard mask HM at right angles (orthogonally) to the window W2" therethrough, down through the TEOS layer CP, through the upper portion of the interlayer dielectric ILD until the tops of stacks 210A and 210B are exposed. Then the etching continues through the interlayer dielectric layer ILD between the stacks 210A/210B with just a thin portion of the layer ILD remaining at the bottom of the bitline contact opening BCO. The etching is selective in that it etches the silicon nitride of the liner layer 230 and the caps 220 of the stacks 210A/210B very slowly that the BCO reaches partially down into the upper inner portions of two stacks 210A/210B including a portion of the liner 230. The opening BCO is formed between the stacks 210 down to near the bottom of the layer ILD using conventional etching techniques.

FIG. 9 shows the Bitline Contact Opening BCO with a hole H extending between the silicon nitride liners 230 on the sidewalls of the caps 220 below the window W3. The via Bitline Contact Opening BCO etch stops before reaching the bottom of the opening BCO. Thus the doped silicon active area AA is not exposed since it remains covered by the thin layer of the dielectric ILD and, as shown in FIG. 9. Aside from the window W3, the TEOS cap CP is protected by the PR3 line shaping mask LSM. The etch is selective to etch through the polysilicon of the hard mask HM, but it etches the silicon nitride 220 and the liner layer 230 to form a large opening at the top of the silicon nitride caps 220 of stacks 210A/210B.

Figure 10:
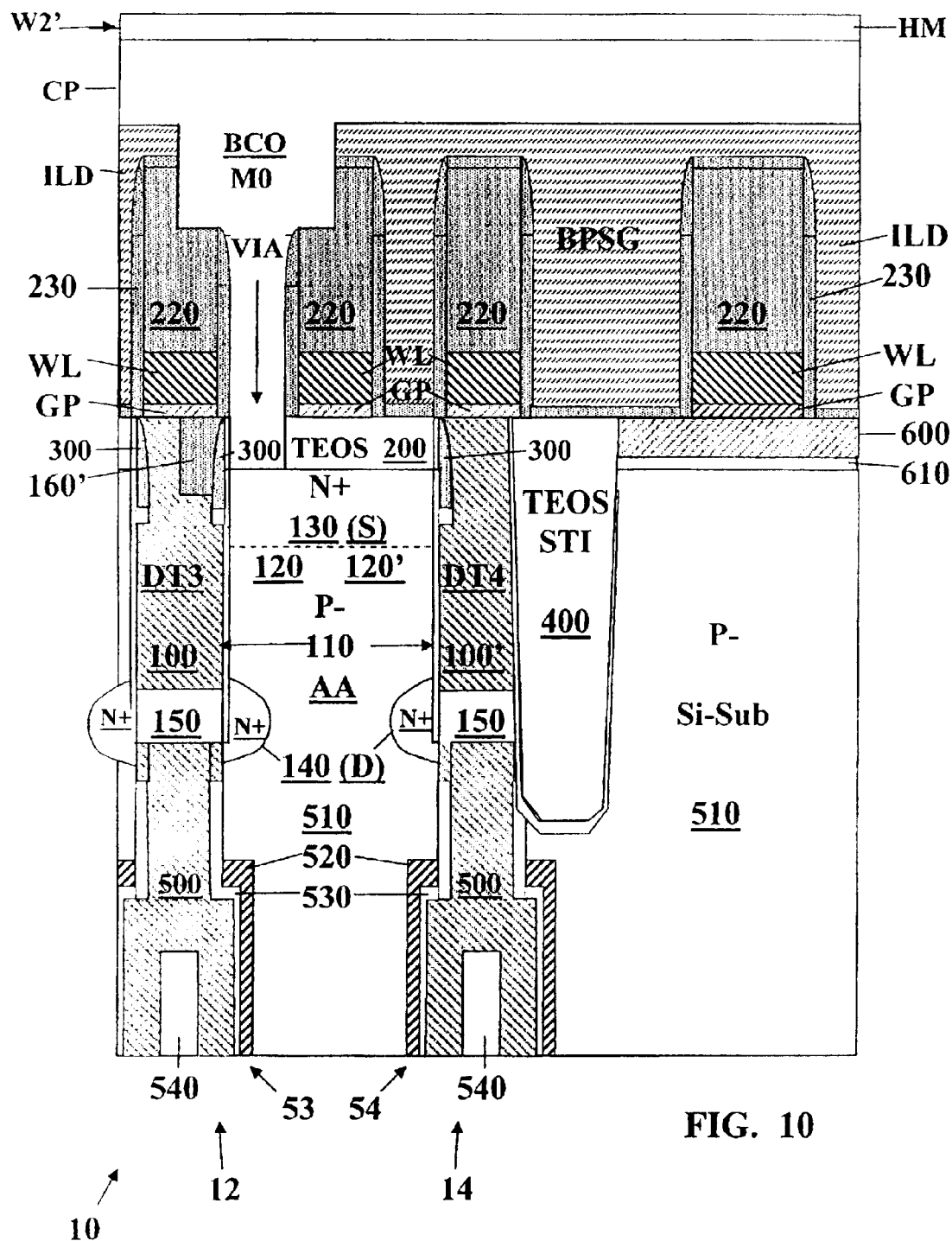
FIG. 10 is a cross-sectional view showing the structure of FIG. 9 after a silicon oxide etch has been performed to complete etching of the bitline contact opening for a via as shown by the layout of bitline contacts.

FIG. 10 is a cross-sectional view showing the structure 10 of FIG. 9 after a silicon oxide etch has been performed to complete etching of the Bitline Contact Opening BCO for a via as shown by the layout of bitline contacts BC. As shown in FIG. 10 the PR3 mask LSM has been stripped away and any exposed silicon oxide such as the cap and the BPSG of the interlayer dielectric ILD have been etched selective to the silicon nitride caps CP and the silicon nitride spacers as well as the hard mask HM (polysilicon) to extend the bitline contact opening BCO to the top surface of source region 130 and to etch through the window W2" through the hard mask HM to form the M0 wiring trench in the TEOS cap CP which remains in place behind the buried contact opening BCO and lining either side of the transverse M0 wiring trench. Thus the bit contact VIA hole has been formed by completion of etching the buried contact opening BCO down to the common source region 130. Since the area covered by polysilicon hard mask HM will be protected, a via pattern can be formed as shown in FIG. 10, with each DT having one bitline via for a contact BC. Thus the silicon oxide (TEOS) cap CP has been etched through mask W2' at the same time as the bitline contact etch through the remaining dielectric ILD at the bottom of the opening BCO has been completed to the bottom of the VIA in one step.

Bitline Contact and Bit/ine Formation

FIGS. 11A and 11B show the structure 10 of FIG. 10 after the hard mask HM has been removed.

After formation of the bitline via holes BCO has been completed, doped polysilicon or W metal is deposited to fill the bitline via holes BCO to form the Bitline Contact Vias BCV and bitlines M0, as illustrated in FIGS. 11A and 11B. In FIG. 11A doped polysilicon bitline contact vias BCB are deposited into the Bitline Contact Opening BCO and recessed.

Support contacts (CS) are formed on the periphery of the DRAM/e-DRAM vertical MOSFET structure 10, as will be well understood by those skilled in the art.

A Ti/TiN liner LI is sputtered and annealed over the Bitline Contact Vias BCV.

Tungsten bitlines M0 composed of tungsten W are filled and planarized by CMP. Bitline contact and bitlines M0 lines are formed. These are all standard process. Other process options are allowed, such as full W bitline process.

While this invention has been described in terms of the above specific embodiment(s), those skilled in the art will recognize that the invention can be practiced with modification within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method for providing a bitline contact in an integrated circuit structure, including a substrate with a top surface and a body, a deep trench formed in the body with upper and lower sidewalls, a deep trench capacitor and a gate electrode formed in the deep trench, the gate electrode being separated from the body by gate oxide and the deep trench capacitor being separated from the body by a capacitor dielectric layer; a doped source region juxtaposed with the gate electrode near the top surface aside from the gate oxide; and a drain region formed in the body of the substrate connected to the capacitor, with sidewall spacers between the gate electrode and the upper sidewalls of the deep trench, the method comprising:

forming a patterning mask over the device exposing a portion of an upper surface of the gate electrode at the top surface of the substrate, the patterning mask being patterned by the line shaping master mask, etching a divot reaching down into the gate electrode alongside a deep trench sidewall spacer juxtaposed with the source region and filling the divot with a dielectric material, forming a wordline stack with a wordline in contact with the gate electrode, forming a conformal liner which is etch resistant covering the structure, forming at least one dielectric layer covering the conformal liner, planarizing the dielectric layer above the wordline stack, forming a bitline contact mask patterned by the line shaping master mask, a bitline contact therethrough above the source region juxtaposed with the deep trench sidewall spacer, and etching a via hole down to the source region in the pattern of the bitline contact mask.

2. The method of claim 1 wherein the bitline contact mask has been formed over an M0 wiring line hard mask and the bitline contact mask is employed to etch an opening through a line in an M0 hard mask through the dielectric layer therebelow including a portion of the liner covering the wordline with an etchant selective to the hard mask and then removing the bitline contact mask and etching selective to the etch resistant liner.

3. The method of claim 2 with an opening in the bitline contact mask projecting at right angles in the horizontal plane relative to the opening in the M0 hard mask.

4. The method of claim 1 wherein the etch resistant liner comprises a conformal layer of silicon nitride.

5. The method of claim 1 wherein:
   the wordline stack includes a conductive wordline covered with a silicon nitride cap, and
   the etch resistant liner comprises a conformal layer of silicon nitride.

6. The method of claim 1 wherein planarization is performed by CMP.

7. The method of claim 1 wherein the dielectric layer is an ILD layer which is next planarized and then covered in turn by a TEOS glass layer.

8. The method of claim 1 wherein the dielectric layer is an ILD layer which is next planarized by CMP and then covered in turn by a TEOS glass layer.

9. The method of claim 1 wherein the divot is filled with silicon nitride.

10. The method of claim 1 wherein the divot is filled with silicon nitride by depositing a thick layer thereof followed by planarization.

11. A method for providing a bitline contact in an integrated circuit structure, including a substrate with a top surface and a body, a plurality of deep trenches formed in the body with upper and lower sidewalls, with a deep trench capacitor and a gate electrode formed in the deep trenches, the gate electrodes being separated from the body by gate oxide and the deep trench capacitors being separated from the body by capacitor dielectric layers; a doped source region juxtaposed with the gate electrodes near the top surface aside from the gate oxide; and drain regions formed in the body of the substrate connected to the capacitor, with sidewall spacers between the gate electrodes and the upper sidewalls of the deep trench, the method comprising:

forming a patterning mask over the device exposing a portion of an upper surface of a gate electrode at the top surface of the substrate, the patterning mask being patterned by the line shaping master mask, etching a divot reaching down into the gate electrode alongside a deep trench sidewall spacer juxtaposed with a source region and filling the divot with a dielectric material, forming a wordline stack with a wordline and a silicon nitride cap in contact with the gate electrode, forming a conformal liner which is etch resistant covering the structure, forming a planarized ILD layer covering the conformal liner, forming a glass layer covering the planarized ILD layer, forming a bitline contact mask patterned by the line shaping master mask, a bitline contact therethrough above the source region juxtaposed with the deep trench sidewall spacer, etching a via hole down to the source region in the pattern of the bitline contact mask, and forming a bitline contact in the via hole.

12. The method of claim 11 wherein the etch resistant liner comprises a conformal layer of silicon nitride.

13. The method of claim 11 wherein the bitline contact mask has been formed over an M0 wiring line hard mask and the bitline contact mask is employed to etch an opening through a line in an M0 hard mask through the dielectric layer therebelow including a portion of the liner covering the wordline with an etchant selective to the hard mask and then removing the bitline contact mask and etching selective to the etch resistant liner.

14. The method of claim 13 wherein the bitline contact mask has an opening projecting at right angles in the horizontal plane relative to the opening in the M0 hard mask.

15. The method of claim 13 wherein the etch resistant liner comprises a conformal layer of silicon nitride.

16. The method of claim 11 wherein planarization is performed by CMP.

17. The method of claim 11 wherein the ILD layer planarized and then covered in turn by a TEOS glass layer.

18. The method of claim 13 wherein the ILD layer is planarized by CMP and then covered in turn by a TEOS glass layer.

19. The method of claim 11 wherein the divot is filled with silicon nitride.

20. The method of claim 11 wherein the divot is filled with silicon nitride by depositing a thick layer thereof followed by planarization.

* * * * *